United States Patent [19]

Huff

[11] Patent Number: 5,180,977

[45] Date of Patent: Jan. 19, 1993

[54] MEMBRANE PROBE CONTACT BUMP COMPLIANCY SYSTEM

[75] Inventor: Richard E. Huff, Belmont, Calif.

[73] Assignee: Hoya Corporation USA, San Jose, Calif.

[21] Appl. No.: 801,702

[22] Filed: Dec. 2, 1991

[51] Int. Cl.⁵ .................. G01R 1/06; G01R 31/02
[52] U.S. Cl. .................. 324/158 P; 324/158 F
[58] Field of Search ............. 324/158 P, 158 F, 73.1, 324/158 R, 72.5

[56] References Cited

U.S. PATENT DOCUMENTS

| | | | |
|---|---|---|---|
| 4,636,722 | 1/1987 | Ardezzone | 324/158 P |
| 4,906,920 | 3/1990 | Huff et al. | 324/158 |
| 4,918,383 | 4/1990 | Huff et al. | 324/158 |

FOREIGN PATENT DOCUMENTS 0331282  6/1989  European Pat. Off. ........ 324/158 P

*Primary Examiner*—Ernest F. Karlsen
*Attorney, Agent, or Firm*—Thomas E. Schatzel

[57] ABSTRACT

The present invention provides a membrane probe contact bump compliancy system implemented in an integrated circuit (IC) testing system to nondestructively test a wafer. This integrated circuit system includes a test controller which is capable of controlling and executing a set of test programs, a wafer dispensing system, and a probe card. Under control of the test controller, the wafer dispensing system handles and controls the wafer for the performance of said set of test program. The probe card has a performance board and a plurality of probes. In cooperation with the wafer dispensing system, the probe card positions each of the probes to engage the wafer substantially at a predefined location with a controlled amount of force. The performance board further includes a transmission line corresponding to each probe. The probes are affixed to the performance board with each probe connected to a corresponding transmission line such that each probe is in electric communication with the test controller via the performance board. The probe card further includes a probe compliancy system disposed between the performance board and the probes. The compliancy system includes at least one elastomer layer and at least one deflectable protection layer. The probe compliancy system cushions the probes in engaging the wafer and the deflectable protection layers protect the elastomeric layers.

10 Claims, 1 Drawing Sheet

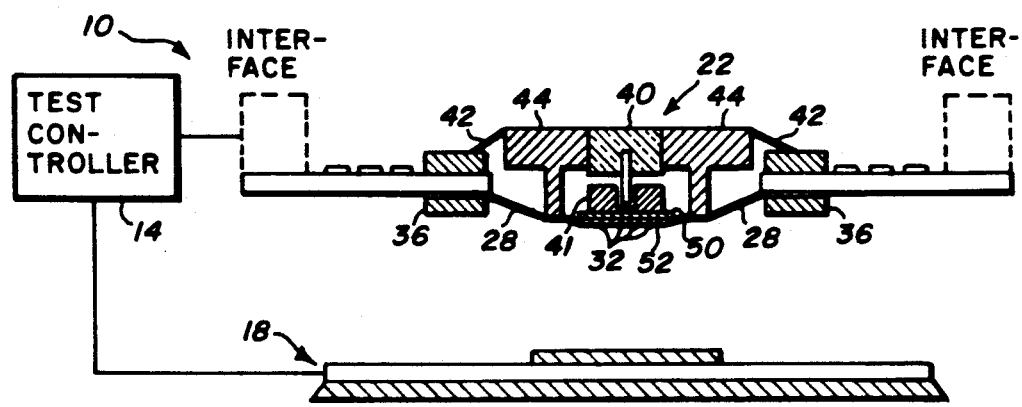
Fig_1
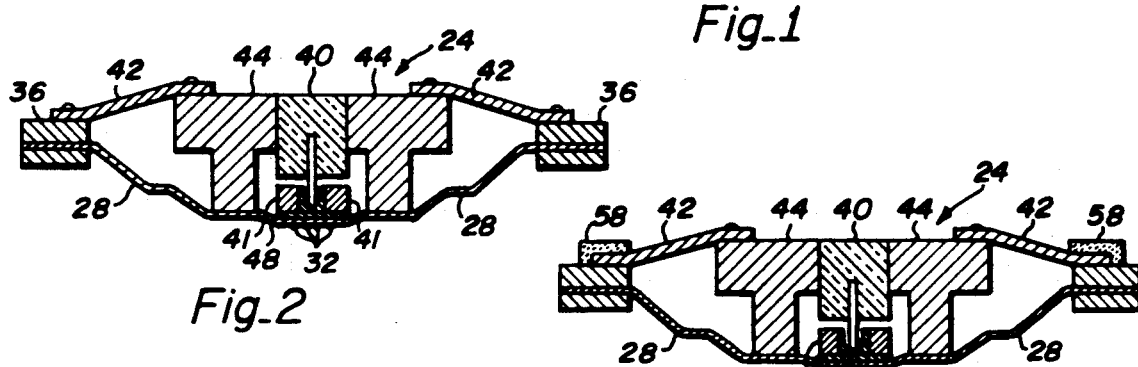
Fig_2
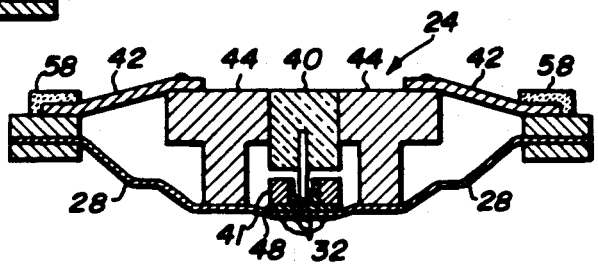
Fig_4a
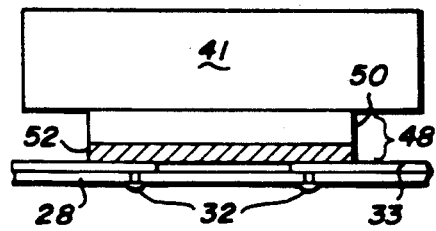
Fig_2a
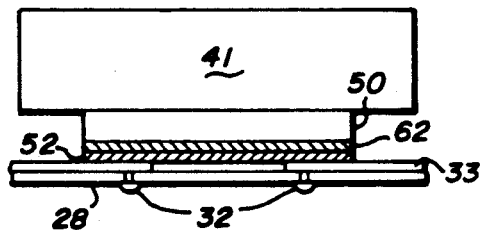
Fig_4b
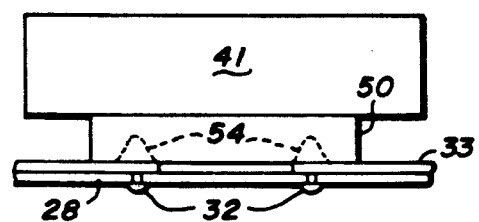
Fig_3a (PRIOR ART)
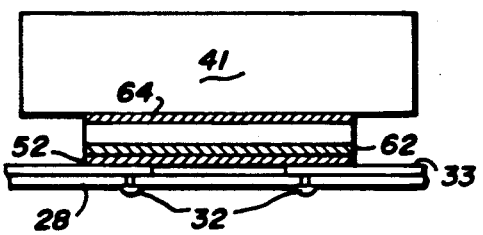
Fig_4c
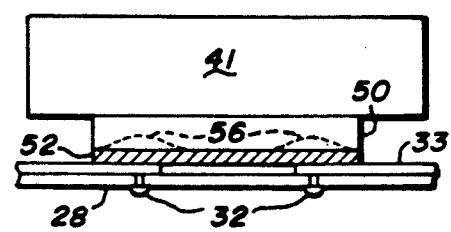
Fig_3b

MEMBRANE PROBE CONTACT BUMP COMPLIANCY SYSTEM

BACKGROUND OF THE INVENTION

1. Field of the Invention

This invention relates generally to the nondestructive testing of integrated circuits (ICs) and more specifically to a probe testing system including a compliancy system capable of reliably cushioning the contact force between the probes and the device under test (DUT).

2. Description of the Prior Art

Integrated circuits are manufactured by forming multiple layers of semiconductor circuits generally with repeated and fixed patterns to develop a plurality of "chips" on a thin planar substrate, i.e., a wafer. The wafers are then cut into individual chips for further processing and packaging. Individual chips, however, must first be inspected and tested to assure the quality and the reliability of the final products made from these semiconductor chips.

The testing operation is performed at a wafer level before the wafers are sawn apart into individual chips. The testing system typically comprises a test controller, which executes and controls the test programs; a wafer dispensing system, which mechanically handles and positions the wafers for testing; and a probe card, which maintains an accurate mechanical contact with the device under test (DUT) and provides an electrical interface between the test controller and the DUT. The probe card includes a printed circuit board known as the 'performance board'. A performance board may be designed for individual ICs or IC families. The probe card also has a plurality of test probes which are accurately positioned to coincide with the input/output (I/O) pads of the device under test (DUT).

Under control of the test controller, a set of testing signals including of specific combinations of voltages and currents are generated and transmitted to the DUT via the performance board and the test probes. The output of the chips in response to the test signals are detected and transmitted by the probes to the test controller via the performance board. The voltage, current or frequency responses from the DUT are analyzed and compared with a set of predetermined allowable ranges. Chips which fail to meet the testing criteria are identified and rejected and the remainder of the tested chips are accepted for further process.

A conventional type of wafer probe card consists of a set of fine styluses or probes mounted on the performance board. The probes are arranged so that their tips form a pattern identical to that of the DUT's contact pads. The other ends of the probes are soldered to the traces of the printed circuits on the performance board for further connection to the test controller. The wafer dispensing system brings the wafer to be tested to an aligned position under the probe card and raises the wafer until proper contacts are established between the probes and DUT's input/output (I/O) pads.

Membrane probe technology has also been developed by forming an array of microcontacts, generally known as contact bumps, on a thin and flexible dielectric film, i.e., a membrane. For each contact bump, a microstrip transmission line is formed on the membrane for electric connection to the performance board. The contact bumps are formed by a metal plating method. The microstrips are formed by use of the photolithographic methods. Because the contact bumps can be formed right on the membrane, unlike the conventional probes, membrane probes have no extending needles or blades to hold the fine probe tips in place. The contact bumps can be formed to create a large number of contacts with high probe density. Additionally, improvements in mechanical and electric performance are realized by the membrane probes because of the simplicity of its configurations.

One critical prerequisite for successful IC test by either the membrane or conventional probe cards is to establish proper electrical contact between the probes and the DUT's input/output pads. In practical testing operations, the probe card and its probe tips or the contact bumps may not be exactly coplanar with the surface of the DUT's I/O pads. In the case of membrane probe cards, a self-leveling system (U.S. Pat. No. 4,906,920) is used to accommodate this non-coplanarity condition. To compensate for the same such variations with conventional probe cards, the wafer dispensing system is controlled to raise the wafer a predetermined distance beyond the first point of contact to assure proper contact with all probes. Such practice is generally referred to as overdrive.

Another factor which may affect the testing operation is the nonconductive oxide film which typically forms on the surface of the I/O pads of a DUT. This thin layer is only five to ten nanometers in depth but due to its high degree of resistance the accuracy of current, voltage, or frequency response measurements is severely impaired. In the case of conventional probe cards the problem is resolved by holding the probes at a small angle with respect to the plane of the DUT. As the probes are pushed by the wafer, the probes slide along the surface of the pads. This horizontal movement creates a scrubbing action which removes the oxide film on the surface. For the membrane probe, a scrubbing motion is created by using a set of flexure pivot assemblies. As disclosed in U.S. Pat. No. 4,918,383 entitled "Membrane Probe with Automatic Contact Scrub Action" by Huff et al. (Apr. 17, 1990).

The probes and the membrane with its contact bumps are therefore subjected to the forces of vertical 'overdrive' and horizontal 'pulling' and 'scrubbing' in the test operations. These stressful operation conditions can cause the membrane to lose resiliency. Material deteriorations and structure break down can also occur which cause premature damages of the probe card.

U.S. Pat. No. 4,906,920, entitled "Self-leveling Membrane Probe" (issued on May 6, 1990), Huff et al. discloses a self-leveling mechanism to improve the surface coplanar alignment between a membrane probe contact bumps and a DUT. Pivotal pins, together with leaf springs and the translation stages, provide a small angular rotational freedom for surface alignment adjustments. In addition, an elastomeric bed is placed between the self-leveling mechanism and the membrane and its contact bumps to cushion the force of the probe on the DUT.

The self-leveling mechanism and the elastomeric bed are useful in reducing the stress placed upon the contact bumps. However, when exposed to excessive temperature in hot chip testing in combination with excessively high loading forces, all elastomers exhibit a phenomenon known as compression set or creep. This can lead to premature damage of the contact bumps and their transmission lines. The elastomeric layer must be protected in order to prevent such premature damages.

Additionally, the membrane along with the elastomer bed is subject to lateral forces while making the horizontal scrubbing motion to remove the oxide film from the DUT's I/O pads during testing. Excessive overdrive (force) and temperature will result in making these lateral forces unacceptable and can impair the effectiveness of the scrubbing motion. The elastomer layer must be protected in order to prevent loss of mechanical coupling through friction, between the elastomer and the membrane.

SUMMARY OF THE PRESENT INVENTION

It is therefore an object of the present invention to protect the elastomers from compression set damages caused by continuous operation in excessive temperature and high loading conditions.

It is another object of the present invention to protect the elastomers from slipping to assure that sufficient friction is maintained between the elastomer and the membrane and bumps such that the oxide film on DUT's I/O pads is effectively removed.

Briefly, in a preferred embodiment, the present invention comprises a probe card for nondestructively testing an IC wafer. The probe card has a performance board and a plurality of contact bumps. The probe card cooperates with a wafer dispensing system to position each of said plurality of contact bumps engaging the wafer substantially at predefined locations with controlled amount of force. The performance board is electrically connected to and under the control of a test controller. The performance board further has, corresponding to each of the probes, a transmission line. The contact bumps are affixed to the performance board wherein each of said probes is connected to a corresponding transmission line whereby each of the probes is in electrical communication with the performance board and the test controller. The probe card further includes a probe compliancy system disposed between the performance board and the probes. The compliancy system includes at least one elastomer layer and at least one deflectable protection layer whereby the probe compliancy system cushions the probes when engaging the wafer and the deflectable protection layers protect the elastomer layers.

An advantage of the present invention is that it provides additional protection for the elastomer layers. The additional protection prevents the elastomer layers from premature damages due to compression set and therefore improves the probe performance and reliability.

Another advantage of the present invention is that it provides a means to prevent loss of lateral friction caused by material deterioration which often occurs when the elastomer layers are exposed to excessive heat and subject to continuous high loading force. Better probe contacts and more accurate test results are obtained because it enhances the effectiveness of the horizontal scrubbing motion for removal of the oxide film from the I/O pads on a DUT.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 1 is a schematic illustration of a wafer testing system according to the present invention;

FIG. 2 is a cross-sectional view of a membrane probe card according to the present invention;

FIG. 2a is a cross-sectional view of the compliance system according to the present invention;

FIG. 3a shows the yielding pattern of an elastomer layer without a deflectable protection layer as disclosed in the prior art;

FIG. 3b shows the yielding pattern of an elastomer layer with a deflectable protection layer according to the present invention;

FIG. 4a shows a membrane probe card including an automatic contact scrub mechanism and a contact bump compliancy system according to the present invention;

FIG. 4b shows an embodiment of the compliancy system according to the present invention; and FIG. 4c shows an alternative embodiment of the coupling system according to the present invention.

DETAILED DESCRIPTION OF THE PREFERRED EMBODIMENT

FIG.1 is a schematic illustration of an IC wafer test system 10 wherein the present invention is implemented. Test system 10 comprises three major apparatuses: 1) a test controller 14 which is generally referred to as an electronic tester, 2) a wafer dispensing system 18 which is generally referred to as a 'prober', and 3) a probe card 22. Test controller 14 controls and executes test programs. Wafer dispensing system 18 handles and positions an IC wafer, i.e., a DUT, for the performance of the test by probe card 22. Wafer dispensing system 18 and probe card 22 are electrically connected to and under the control of test controller 14. Test controller 14 has the capabilities of executing test software programs and analyzing test results for a determination of whether an IC chip has passed or failed a specific set of IC tests. In a normal test operation, wafer dispensing system 18 brings a DUT to a predefined position such that the wafer's I/O pads contact probe card 22. Specific measurements of currents, voltage, or frequency responses are performed by probe card 22 and these output signals are transmitted to test controller 14 for test analyses.

A specific embodiment of the present invention in a membrane probe card 24 is shown in FIGS. 2 and 2a. Membrane probe card 24 includes a membrane 28 which is a thin dielectric film. A plurality of contact bumps 32 are formed on one side of membrane 28. On the opposite side of membrane 28 a set of microstrip transmission lines 33 are developed for each of contact bumps 32. Each microstrip transmission line 33 is developed as a conductor trace. Contact bumps 32 and microstrip transmission lines 33 are patterned on membrane 28 using photolithographic techniques.

As shown in FIG. 2, membrane 28 is attached to a performance board 36. Performance board 36 is a printed circuit board carrier which carries necessary circuitry components to serve as an interface between membrane 28 and test controller 14. A force delivery mechanism 40 is attached to performance board 36 which imposes vertical and horizontal forces in the process of probe card engagement to the wafer under test. As one example of the embodiments, force delivery mechanism which has an upper translation stage 40, a lower translation stage 41, a plurality of leaf springs 42 and a side translation stage 44 which are attached to membrane 28 and performance board 36. Under the control of test controller 14, force delivery mechanism coupling with wafer dispensing system 18 apply forces to membrane 28 to engage contact bumps 32 to wafer I/O pads. The forces are controlled to assure that good quality of contacts are established between contact bumps 32 and DUT's I/O pads to accurately test the IC chips. A contact compliancy system 48 is placed between lower translation stage 41 and membrane 28 (FIG. 2a). Contact compliancy system 48 comprises a elastomer layer 50 and a deflectable protection layer 52. Contact compliancy system 48 cushions the forces as contact bumps 32 'touch down' on DUT's I/O pads.

In applying forces to contact bumps 32, the membrane 28 and leaf springs 42 provide some degree of flexibility to accommodate small errors in plane alignments between membrane 28 and DUT and the height variations of contact bumps 32 and the testing pads. In practical test operations, to assure low resistance contacts and accurate measurements, a controlled amount of force, i.e., 'overdrive', is generally applied. Membrane 28 is operated with low tension and therefore allows a degree of independent motion of contact bumps 32.

FIG. 3a shows the effects imposed on elastomer layer 50 caused by the overdrive and the independent motion of contact bumps 32 without the protection provided by deflectable protection layer 52. A region close to the surface of elastomer layer 50 immediately above a contact bump 32, i.e., region 54, is pressed to create a local yielding pattern which creates a cushion effect when contact bumps 32 encounter the wafer's I/O pads. Region 54 is subject to heavy cyclic duty which leads to premature loss of elasticity and the effectiveness of cushion.

FIG. 3b shows the configuration of elastomer layer 50 and deflectable protection layer 52 impacted with identical forces. A yielding pattern 56 is produced which spreads over a more extensive area and provides a similar soft-landing cushion effect. Under the protection of deflectable protection layer 52, elastomer layer 50 receives much less localized acute force. Deflectable protection layer may be a thin layer of glass which can endure high temperature testing and resist compression set.

FIG. 4a shows an alternative embodiment of the present invention where force delivery mechanism comprises an automatic contact scrub mechanism 58, similar to that disclosed in U.S. Pat. No. 4,918,313. Automatic contact scrub mechanism 58 provides an automatic lateral scrubbing motion when membrane 28 engages a DUT. As shown in FIG. 4b, a very thin layer, i.e., elastomeric friction layer 62, is placed between protection layer 52 and membrane 28. The elastomeric friction layer 62 is made of rubber-like elastomer material. Elastomeric friction layer 62 is securely attached to protection layer 52 and membrane 28. Elastomeric friction layer 62 not only provides additional protection for elastomer layer 50, it also enhances the effectiveness of oxide film removal actuated by automatic contact scrub mechanism 58 by assuring sufficient lateral friction exists between layers composed of different materials.

FIG. 4c shows another alternative embodiment present invention where force delivery mechanism also comprises an automatic contact scrub mechanism 58. Compliancy system 48 comprises one elastomer layer 50, one deflectable protection layer 52, and two layers of elastomeric friction layers 62 and 64. Elastomeric friction layer 62 lies between membrane 28 and elastomer layer 50 and elastomeric friction layer 64 lies between elastomer layer 50 and lower translation stage 41.

The elastomeric friction layers 62 and 64 not only provide additional protection for elastomeric layer 50, they also increase the lateral friction between all these layers to assure the effectiveness of scrub motion in oxide film removal.

Although the present invention has been described in terms of the presently preferred embodiment, such disclosure should not be interpreted as limiting. Various alternations and modifications will become apparent to those skilled in the art after reading the above disclosure. Accordingly, it is intended that the appended claims be interpreted as covering all alternations and modifications as fall within the true spirit and scope of the invention.

I claim:

1. An integrated circuit (IC) testing system for nondestructively testing a wafer comprising:
   a test controller capable of controlling and executing a set of test programs;
   a wafer dispensing system for handling and positioning said wafer under the control of the test controller for performing said set of test programs;
   a probe card including a performance board and a plurality of probes, the probe card cooperating with the wafer dispensing system positioning each of said plurality of probes engaging the wafer substantially at a predefined location with a controlled amount of force, said performance board being in electric communication and under control of the test controller and a transmission line corresponding to each of said probes;
   said plurality of probes being affixed to said performance board wherein each of said probes is connected to said corresponding transmission line whereby each of said probes is in electric communication with the test controller via said performance board; and
   said probe card further including a probe compliancy system including at least one elastomer layer and at least one deflectable protection layer whereby said probe compliancy system cushions said probes in engaging the wafer and said deflectable protection layers protects said elastomer layers.

2. An integrated circuit (IC) testing system for nondestructively testing a wafer comprising:
   a test controller capable of controlling and executing a set of test programs;
   a wafer dispensing system for handling and positioning said wafer under the control of the test controller for performing said set of test programs;
   a probe card including a performance board, a force delivery mechanism, and a membrane, said force delivery mechanism being affixed to and coupled with said performance board;
   said membrane having a first side and a second side, said first side being affixed to said force delivery mechanism and said second side having a plurality of contact bumps, each of said plurality of contact bumps having a corresponding transmission line extending through said first side of said membrane for connecting to said performance board; the probe card cooperating with the wafer dispensing system positioning each of said plurality of contact bumps engaging the wafer substantially at a predefined location with a controlled amount of force;
   said performance board being in electric communication and under control of the test controller, each of said plurality of contact bumps further being in electric communication with the test controller via said performance board; and the probe card further including a probe compliancy system disposed between said force delivery mechanism stage and said membrane, said compliancy system including at least one elastomer layer and at least one deflectable protection layer whereby said probe compliancy system cushions said contact bumps in engaging the wafer and said deflectable protection layers protects said elastomer layers.

3. A membrane probe card for nondestructively testing an integrated circuit (IC) wafer comprising:

a performance board having a plurality of electronic circuits for receiving a plurality of control and test signals in performing said nondestructive test;

a force delivery mechanism being affixed to and coupled with the performance board;

a membrane having a first side and a second side, said first side being affixed to the force delivery mechanism and said second side having a plurality of contact bumps, each of said plurality of contact bumps having a corresponding transmission line extending through said first side of the membrane for connecting to the performance board whereby each of said contact bumps is in electric communication with the performance board;

the performance board in receiving said plurality of control and test signals including means for controlling the force delivery mechanism and for positioning each of said plurality of contact bumps engaging said wafer substantially at predefined locations with a controlled amount of force; and a probe compliancy system disposed between the force delivery mechanism and the membrane, the compliancy system including at least one elastomer layer and at least one deflectable protection layer whereby the probe compliancy system cushions said contact bumps in engaging said wafer and said deflectable protection layers protect said elastomer layers.

4. A membrane probe card of claims 3 wherein each of said deflectable protection layers is a thin layer of glass.

5. A membrane probe card of claim 3 wherein:

the probe compliancy system further includes at least one elastomeric friction layer to increase the lateral contact friction.

6. A membrane probe card of claim 3 wherein the force delivery mechanism further comprises:

a self leveling mechanism coupling the performance board and the membrane, said self leveling mechanism including an upper translation stage and a lower translation stage with said upper translation stage engaging the performance board and said lower translation stage engaging the membrane; and the self leveling mechanism further including a pivotal pin extending from said upper translation stage to said lower translation stage to allow said upper and said lower translation stages to move relative to each other a small angular rotation whereby adjusting the membrane to be coplanar with said wafer under test.

7. A membrane probe card of claim 3 wherein the force delivery mechanism further comprises:

a translation stage coupling the performance board and the membrane; and an automatic contact scrubbing mechanism including a plurality of flexure pivot assemblies attached to the performance board and said translation stage, said plurality of flexure pivot assemblies creating an asymmetrical horizontal imbalance as said plurality of contact bumps engaging said wafer whereby said contact bumps scrub said wafer causing removal of an oxide film thereon.

8.. A membrane probe card of claim 7 wherein the probe compliancy system includes:

an elastomer layer, a deflectable protection layer, and an elastomeric friction layer;

the elastomer layer engages said translation stage, said elastomeric friction layer engages the membrane, and said deflectable protection layer disposed between said elastomer layer and said first elastomeric friction layer; and said first elastomeric friction layer is further securely coupled to said deflectable protection layer and the membrane to increase lateral friction between the membrane and said deflectable protection layer.

9. A membrane probe card of claim 7 wherein the probe compliancy system includes:

an elastomer layer, a deflectable protection layer, a first elastomeric friction layer, and a second elastomeric friction layer; and said first elastomeric friction layer is securely coupled to the translation stage and said elastomer layer, said second elastomeric friction layer is securely coupled to said elastomer layer and the membrane whereby the lateral friction between the translation stage and said elastomer layer and the lateral friction between said elastomer layer and the membrane are increased.

10. A membrane probe card for nondestructively testing an integrated circuit (IC) wafer comprising:

a performance board having a plurality of electronic circuits for receiving a plurality of control and test signals in performing said nondestructive test;

a force delivery mechanism affixed to and coupled with the performance board, the force delivery mechanism including an upper translation stage and a lower translation stage, said upper translation stage engaging the performance board and said lower translation stage engaging the membrane, a pivotal pin extending from said upper translation stage to said lower translation stage to allow said upper and said lower translation stages to move relative to each other over a small angular rotation;

a membrane having a first side and a second side with said first side affixed to said lower translation stage and said second side having a plurality of contact bumps, each of said plurality of contact bumps having a corresponding transmission line extending through said first side of the membrane;

the performance board including means for controlling the force delivery mechanism and for positioning each of said plurality of contact bumps engaging the wafer substantially at a predefined locations with a controlled amount of force;

the force delivery mechanism further including an automatic contact scrubbing mechanism having a plurality of flexure pivot assemblies attached to the performance board and said upper translation stage, said plurality of flexure pivot assemblies creating an asymmetrical horizontal imbalance as said plurality of contact bumps engaging said wafer whereby said contact bumps scrubs said wafer causing removal of an oxide film thereon;

the performance board further being connected to said transmission lines whereby each of said contact bumps is in electric communication with the performance board; and a probe compliancy system disposed between said lower translation stage and the membrane and including at least one elastomer layer and at least one deflectable protection layer whereby the probe compliancy system cushions said contact bumps in engaging said wafer and said deflectable protection layers protect said elastomer layers.

* * * * *